(12) United States Patent
Koyama et al.

(10) Patent No.: US 11,506,839 B2
(45) Date of Patent: Nov. 22, 2022

(54) BEAM DEFLECTION DEVICE

(71) Applicant: TOKYO INSTITUTE OF TECHNOLOGY, Tokyo (JP)

(72) Inventors: Fumio Koyama, Tokyo (JP); Xiaodong Gu, Tokyo (JP)

(73) Assignee: TOKYO INSTITUTE OF TECHNOLOGY, Tokyo (JP)

(*) Notice: Subject to any disclaimer, the term of this patent is extended or adjusted under 35 U.S.C. 154(b) by 168 days.

(21) Appl. No.: 16/970,067

(22) PCT Filed: Feb. 13, 2019

(86) PCT No.: PCT/JP2019/004939
§ 371 (c)(1),
(2) Date: Aug. 14, 2020

(87) PCT Pub. No.: WO2019/159918
PCT Pub. Date: Aug. 22, 2019

(65) Prior Publication Data
US 2020/0408988 A1    Dec. 31, 2020

(30) Foreign Application Priority Data
Feb. 14, 2018    (JP) .............................. JP2018-023697

(51) Int. Cl.
*G02B 6/125*    (2006.01)
(52) U.S. Cl.
CPC .................................. *G02B 6/125* (2013.01)
(58) Field of Classification Search
CPC ......... G02B 6/125; H01S 5/101; H01S 5/026; H01S 5/18375; H01S 5/18377; H01S 5/18394; H01S 5/5045; H01S 5/423; H01S 2301/18; G02F 1/295
See application file for complete search history.

(56) References Cited

U.S. PATENT DOCUMENTS 8,320,621 B2    11/2012  McEldowney
11,126,059 B2*   9/2021  Inada ..................... G02F 1/2257
2014/0211215 A1   7/2014  Pesach et al.
(Continued)

FOREIGN PATENT DOCUMENTS

JP    2004333369 A    11/2004
JP    2013016591 A     1/2013
JP    2017157609 A     9/2017
(Continued)

OTHER PUBLICATIONS

JPO Notification of Reasons for Refusal for corresponding JP Application No. 2018-023697; dated Oct. 19, 2021.
(Continued)

*Primary Examiner* — John Bedtelyon
(74) *Attorney, Agent, or Firm* — Cantor Colburn LLP

(57) ABSTRACT

A beam deflection device includes multiple light-emission structures arranged adjacent to each other in a first direction (X direction). The light-emission structures are each configured to be capable of emitting, from its device surface, a line beam that extends in the first direction in the far field. Furthermore, the light-emission structures are each configured to allow the line beam to be scanned in a second direction (Y direction) that is orthogonal to the first direction.

8 Claims, 14 Drawing Sheets

(56) References Cited

U.S. PATENT DOCUMENTS

2016/0025993 A1     1/2016    Mor et al.
2017/0371227 A1    12/2017    Skirlo

FOREIGN PATENT DOCUMENTS

WO      2016170890 A1    10/2016
WO      2018003852 A1     1/2018

OTHER PUBLICATIONS

Matsuda et al., "Laser printer scanning system with a parabolic mirror", Applied Optics, vol. 17, Issue 6, pp. 878-884; Mar. 15, 1978.

Van Kessel et al., "A MEMS-based Projection Display", Proceedings of the IEEE, vol. 86, No. 8, pp. 1687-1704; (Dated: Aug. 1998).

Nakamura et al., "Wide-angle, low-voltage electro-optic beam deflection based on space-charge-controlled mode of electrical conduction in KTa 1–x NbxO3", Applied Physics Letters, vol. 89, Issue 13, 4 pages; Submitted Jun. 5, 2006, Pubished online, Sep. 28, 2006.

Kurosaka et al., "On-chip beam-steering photonic-crystal lasers", Nature Photonics, vol. 4, pp. 447-450; (Dated, Jul. 2010).

Doylend et al., "Two-dimensional free-space beam steering with an optical phased array on silicon-on-insulator", Optics Express, vol. 19, No. 22, pp. 21595-21604; Dated Oct. 24, 2011.

Gu et al., "Giant and high-resolution beam steering using slow-light waveguide amplifier", Optics Express, vol. 19, No. 23, pp. 22675-22683; Nov. 7, 2011.

Nakahama et al., "On-Chip High-Resolution Beam Scanner Based on Bragg Reflector Slow-Light Waveguide Amplifier and Tunable Micro-Electro-Mechanical System Vertical Cavity Surface Emitting Laser", Japanese Journal of Applied Physics, vol. 51, No. 4R, 4 pages; (Dated: Mar. 2012).

Kondo et al., "Fan-beam steering device using a photonic crystal slow-light waveguide with surface diffraction grating,"Optics Letters, vol. 42, No. 23, pp. 4990-4993; Dec. 1, 2017.

International Search Report for International Application No. PCT/JP2019/004939; dated May 7, 2019.

PCT International Preliminary Report on Patentability with Written Opinion for International Application No. PCT/JP2019/004939, dated Aug. 18, 2020.

\* cited by examiner

US 11,506,839 B2

BEAM DEFLECTION DEVICE

CROSS REFERENCE TO RELATED APPLICATIONS

This is the U.S. national stage of application No. PCT/JP2019/004939, filed on Feb. 13, 2019. Priority under 35 U.S.C. § 119(a) and 35 U.S.C. § 365(b) is claimed from Japanese Application No. 2018-023697, filed Feb. 14, 2018, the disclosure of which is also incorporated herein by reference.

BACKGROUND

1. Technical Field

The present invention relates to a beam deflection device.

2. Description of the Related Art

In recent years, the use of lasers for three-dimensional measurement applications has been expanding. Typical examples of such three-dimensional measurement applications include: laser radar (LIDAR) to be mounted on a vehicle, drone, robot, etc.; 3D sensors to be mounted on a personal computer, smartphone, etc., so as to support face authentication; safety monitoring systems; and automatic inspection apparatuses, etc.

Examples of measurement methods employed in three-dimensional projectors using lasers include: a structured light method in which a structured light patterned in a dot shape is emitted to a measurement target, and depth information is acquired based on the pattern distortion (Patent documents 1 through 3); a light section method in which a line-shaped laser beam (which will be referred to as a "line beam" hereafter) is emitted to a measurement target, and the line beam is scanned or the measurement target is moved so as to acquire a three-dimensional structure (e.g., Patent document 4).

Furthermore, laser manufacturing applications have also been expanding. Such laser manufacturing requires no die, thereby allowing the time and costs required for design and manufacturing to be dramatically reduced. However, such laser manufacturing applications require high beam quality and high output on the order of 100 W.

As described above, there is a demand for a compact, high-power semiconductor device that is capable of directly scanning a laser beam without the need for movable components or optical components. The present inventors have proposed and developed a beam deflection device employing a VCSEL structure (e.g., Patent documents 5 and 6).

SUMMARY

The present invention has been made in view of such a situation.

An embodiment of the present invention relates to a beam deflection device. The beam deflection device includes multiple linear slow-light waveguides arranged adjacent to each other in a first direction. Each linear slow-light waveguide is structured to have a rectangular outlet opening with the first direction as a lateral direction thereof and with a second direction that is orthogonal to the first direction as a longitudinal direction thereof. The beam deflection device is configured to allow the resonance wavelength of the linear slow-light waveguides and the wavelength of slow light generated as a propagating wave that propagates through the linear slow-light waveguides to be relatively controlled.

Another embodiment of the present invention also relates to a beam deflection device. The beam deflection device includes multiple light-emission structures arranged adjacent to each other in a first direction. The multiple light-emission structures are each structured to emit, from a device surface thereof, a line beam that extends in the first direction in the far field. The light-emission structures are each structured to allow the line beam to be scanned in a second direction that is orthogonal to the first direction.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Overview of the Embodiments

Figure 1:
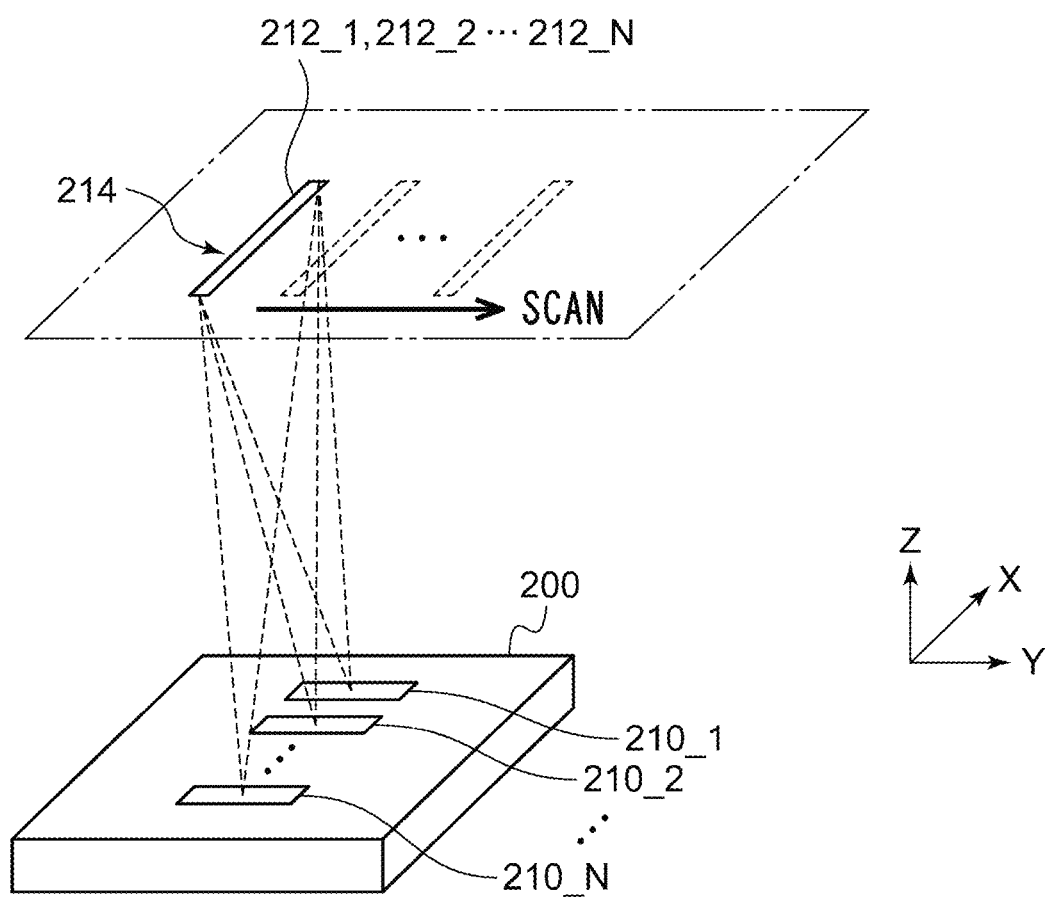
FIG. 1 is a diagram showing a basic configuration of a beam deflection device.

An embodiment disclosed in the present specification relates to a beam deflection device. The beam deflection device includes multiple linear slow-light waveguides arranged adjacent to each other in a first direction. Each linear slow-light waveguide is structured to have a rectangular outlet opening with the first direction as a lateral direction thereof and with a second direction that is orthogonal to the first direction as a longitudinal direction thereof. The beam deflection device is configured to allow the resonance wavelength of the linear slow-light waveguides and the wavelength of slow light generated as a propagating wave that propagates through the linear slow-light waveguides to be relatively controlled. Each linear slow-light waveguide emits, from its outlet opening, a line pattern with the first direction as its longitudinal direction in the far field. The multiple line patterns generated by the multiple linear slow-light waveguides interfere with each other in the far field. By adjusting the size of each outlet opening and the pitch of the multiple linear slow-light waveguides, this arrangement is capable of generating a desired interference pattern. By scanning the multiple line patterns in the second direction based on the relative relation between the resonance wavelength of each linear slow-light waveguide and the wavelength of slow light generated as a propagating wave thereof, this arrangement is capable of scanning the interference pattern.

With an embodiment, the beam deflection device may further include multiple coupling waveguides structured to couple the multiple linear slow-light waveguides so as to form a meander waveguide having a meander structure. With such an arrangement, the propagation direction of the slow light that propagates through the multiple linear slow-light waveguides is alternately switched for every linear slow-light waveguide. Accordingly, there is a difference in an illuminated region between the odd-numbered linear slow-light waveguides and the even-numbered linear slow-light waveguides. Accordingly, this allows the interference pattern scanning range to be expanded.

With an embodiment, the beam deflection device may further include a seed light source arranged at one end of the meander waveguide and structured to inject seed light. With an embodiment, a seed light source structured to inject seed light may be further provided to one end of each of the multiple linear slow-light waveguides.

With an embodiment, the linear slow-light waveguide may be structured to have a VCSEL (Vertical Cavity Surface Emitting Laser) structure including a DBR (Distributed Bragg Reflector) and an active layer.

With an embodiment, the multiple linear slow-light waveguides may be arranged in parallel at an approximately uniform pitch. This arrangement is capable of generating an interference pattern including multiple dots arranged in the first direction.

Also, the pitch of the multiple linear slow-light waveguides may be adjusted such that the output light of the multiple linear slow-light waveguides generates an interference pattern including multiple dots arranged at a uniform pitch in the far field.

Also, the pitch of the multiple linear slow-light waveguides may be adjusted such that the output light of the multiple linear slow-light waveguides generates a single-peaked interference pattern in the far field. This arrangement is capable of generating an interference pattern including a single dot.

Another embodiment of the present invention also relates to a beam deflection device. The beam deflection device includes multiple light-emission structures arranged adjacent to each other in a first direction. The light-emission structures are each structured to emit, from a device surface thereof, a line beam that extends in the first direction in the far field. The multiple line beams generated by the multiple light-emission structures interfere with each other in the far field, thereby allowing the interference pattern to be scanned in the second direction. The interference pattern can be designed based on the size of each outlet opening and the pitch of the multiple light-emission structures.

Embodiments

Detailed description will be made below regarding an embodiment with reference to several drawings. It should be noted that, in the following description, components having approximately the same functions and configurations will be denoted by the same reference numerals. Redundant description will be made only when necessary.

In some cases, the sizes (thickness, length, width, and the like) of each component shown in the drawings are expanded or reduced as appropriate for ease of understanding. The size relation between multiple components in the drawings does not necessarily match the actual size relation between them. That is to say, even in a case in which a given member A has a length (thickness) that is larger than that of another member B in the drawings, in some cases, in actuality, the member A has a length (thickness) that is smaller than that of the member B.

Basic Configuration

FIG. 1 is a diagram showing a basic configuration of a beam deflection device. A beam deflection device 200 includes multiple N (N≥2) light-emission structures 210_1 through 210_N. The multiple light-emission structures 210_1 through 210_N are arranged adjacent to each other along a first direction (X direction). Each light-emission structure 210 is capable of outputting, from the device surface, a line beam 212 having a linear shape extending in a first direction in the far field. Each light-emission structure 210 is configured to be capable of scanning the line beam 212 in a second direction (Y direction) that is orthogonal to the first direction.

Each line beam $212\_i$ (i=1, 2, . . . ) has a predetermined intensity distribution in the X and Y directions. The intensity distribution is designed based on the size and shape of the outlet opening of the corresponding light-emission structure $210\_i$, and the distance between the outlet opening and a virtual screen on which the line beam 212 is projected. The line beam 212 may have a linear shape or a bent shape having a curvature. The multiple line beams 212_1 through 212_N generated by the multiple light-emission structures 210_1 through 210_N interfere with each other in the far field, thereby generating an interference pattern 214. The interference pattern 214 can be designed based on the pitch between the multiple light-emission structures 210.

The multiple line beams 212_1 through 212_N are simultaneously scanned, thereby scanning the interference pattern 214 in the second direction (Y direction).

Figure 2A:
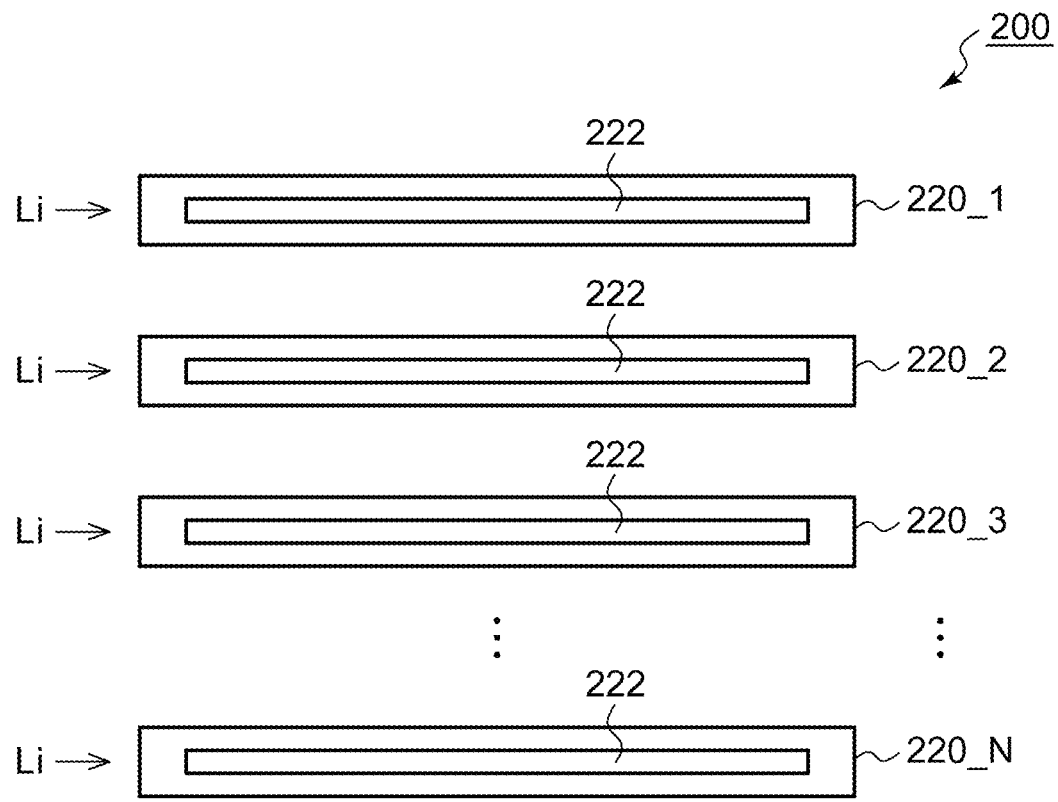
FIG. 2A and FIG. 2B are diagrams each showing an example configuration of the beam deflection device shown in FIG. 1.
Figure 2B:
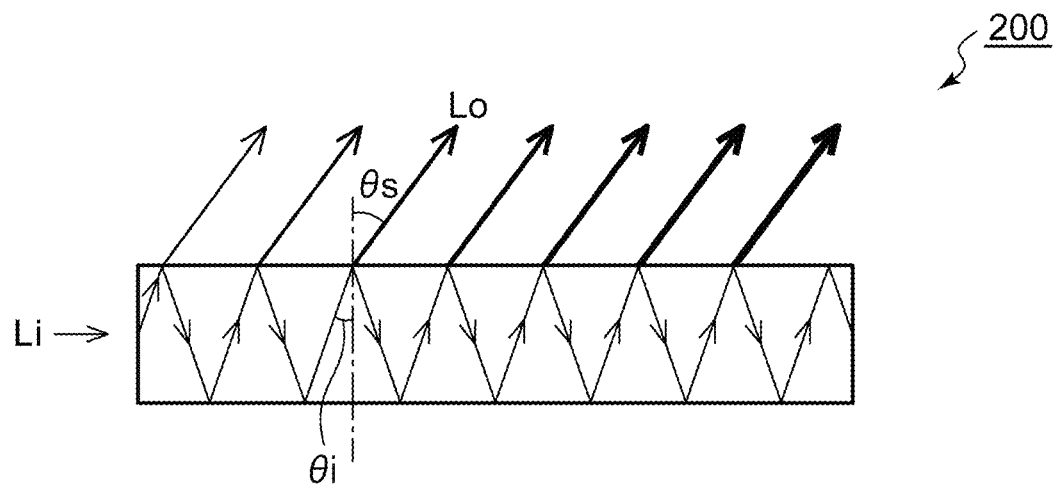

FIG. 2A and FIG. 2B are diagrams each showing an example configuration of the beam deflection device 200 shown in FIG. 1. FIG. 2A shows a plan view of the beam deflection device 200. FIG. 2B shows a cross-sectional view thereof. The beam deflection device 200 includes a plurality of N linear slow-light waveguides (which will be referred to simply as the "linear waveguides" hereafter) 220_1 through 220_N. The multiple linear waveguides 220_1 through 220_N are arranged adjacent to each other along the first direction (X direction in the drawings).

Each linear waveguide 220 may have a VCSEL structure. The linear waveguide 220 has a unique resonance wavelength $\lambda_2$ determined by the resonator length in the vertical direction (Z direction). The linear waveguide 220 amplifies slow light propagating through it. Accordingly, the waveguide 200 is designed to have a longitudinal structure with a waveguide length on the order of 0.5 mm to 10 mm. An unshown driving unit injects a current that is larger than an oscillation threshold current to the linear waveguide 220, thereby providing oscillation at the wavelength $\lambda_2$ determined by the VCSEL structure. In this state, coherent light Li having a wavelength $\lambda_1$ is coupled to one end of the linear waveguide 220, which amplifies and propagates the input light Li as slow light multiply reflected in an approximately vertical direction. The surface of the linear waveguide 220 is provided with a rectangular (slit-shaped) outlet opening 222 with the first direction (X direction) as its lateral direction and with the second direction (Y direction) as its longitudinal direction. Output light Lo having an emission angle $\theta_S$ is emitted from the outlet opening 222 of the linear waveguide 220. The far-field image of the output light appears as a line shape.

With the multiple-reflection angle of the slow light in the linear waveguide 220 as $\theta_i$, and with the emission angle of the output light Lo as $\theta_S$, the following Expression (1) holds true.

$$\sin \theta_S = n \sin \theta_i = n\sqrt{(1-(\lambda_1/\lambda_2)^2)} \tag{1}$$

Here, n represents the refractive index of the linear waveguide 220, and $\lambda_2$ represents the resonance frequency of the waveguide.

The beam deflection device 200 is configured to allow the resonance wavelength $\lambda_2$ of the linear waveguide 220 and the wavelength $\lambda_1$ of the slow light that functions as propagating light that propagates through the linear slow-light waveguides to be relatively controlled. Accordingly, this arrangement is capable of changing the emission angle $\theta_S$ based on the relation between $\lambda_1$ and $\lambda_2$, thereby allowing the output light Lo to be scanned in the Y direction.

In an example, the resonance wavelength $\lambda_2$ of the linear waveguide 220 may be fixed, and the wavelength $\lambda_1$ of the slow light may be scanned. Conversely, in another example, the wavelength $\lambda_1$ of the slow light may be fixed, and the resonance wavelength $\lambda_2$ of the linear waveguide 220 may be scanned. In yet another example, both the wavelength $\lambda_1$ of the slow light and the resonance wavelength $\lambda_2$ of the linear waveguide 220 may be scanned.

Also, light generated by a single common light source may be branched, and the branched light may be coupled with one end of each of the multiple linear waveguides 220. Also, a light source may be coupled to each of the multiple linear waveguides 220.

The present invention encompasses various kinds of apparatuses, methods, and circuits that can be derived from the aforementioned description. That is to say, the present invention is not restricted to a specific configuration. More specific description will be made below regarding examples and modifications for clarification and ease of understanding of the essence of the present invention and the operation thereof. That is to say, the following description will by no means be intended to restrict the technical scope of the present invention.

First Embodiment

Figure 3:
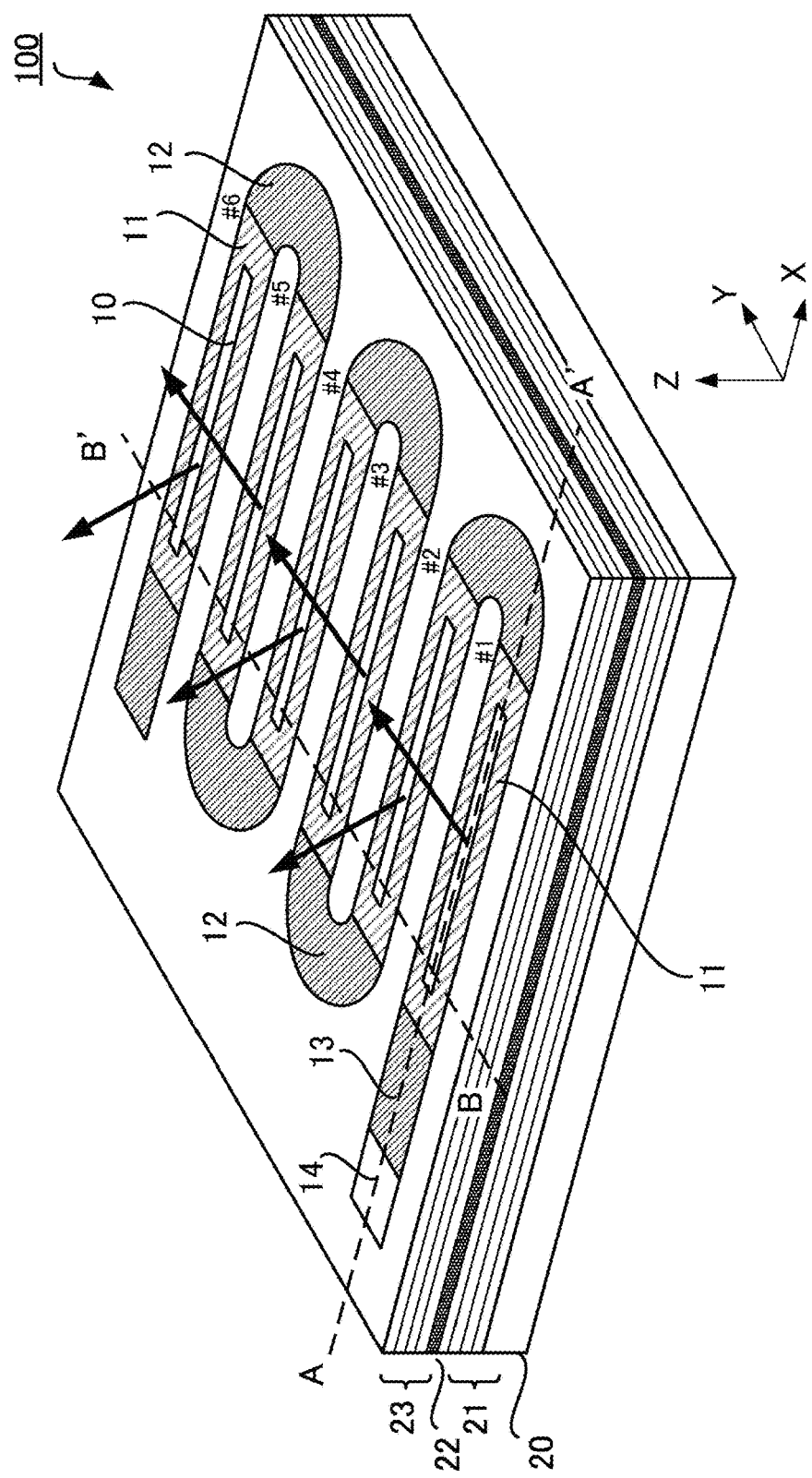
FIG. 3 is a perspective diagram showing a beam deflection device according to a first embodiment.

FIG. 3 is a perspective diagram showing a beam deflection device according to a first embodiment. As shown in FIG. 3, a beam deflection device 100 according to the present embodiment includes multiple linear waveguides 11 each configured as a slow-light waveguide provided with a linear outlet opening 10 such that they are arranged in parallel. Furthermore, the linear waveguides 11 are coupled in series via curved waveguides 12 each configured as a curved slow-light waveguide so as to form a meander-shaped slow-light waveguide. At least one end of the meander-shaped slow-light waveguide is provided with a seed light source 14 configured to inject input light Li via an optical coupling unit 13.

Figure 4:
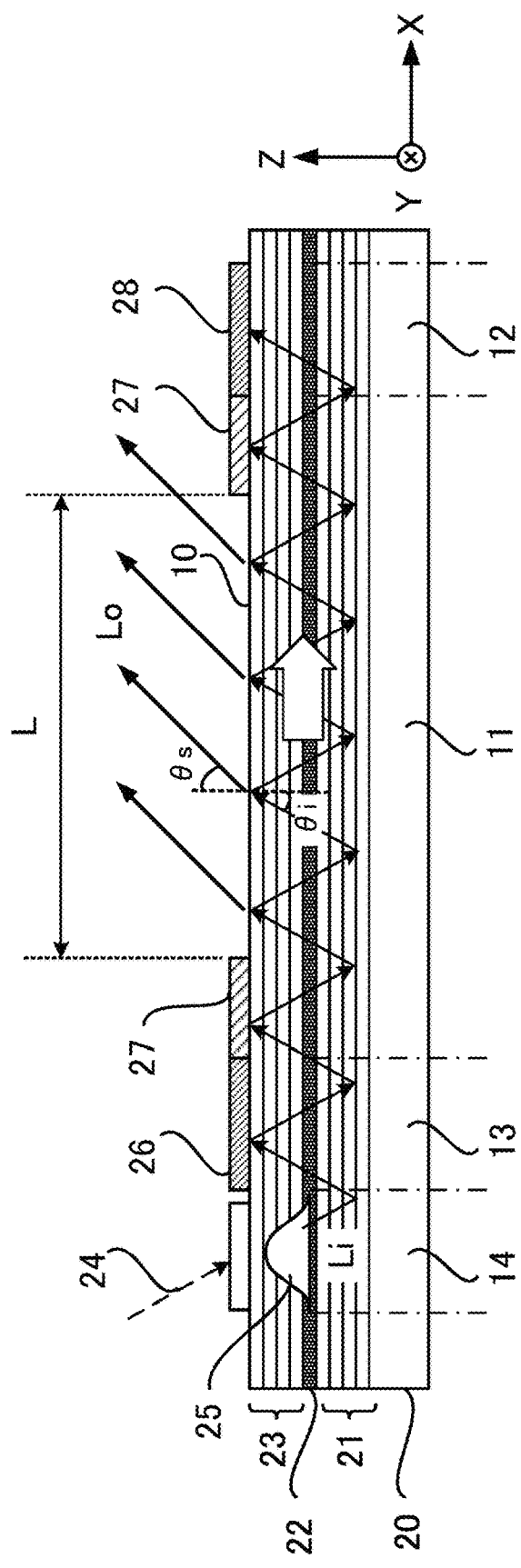
FIG. 4 is a cross-sectional diagram showing the beam deflection device according to the first embodiment taken along the line A-A'.

FIG. 4 is a cross-sectional diagram showing the beam deflection device taken along the line A-A'. The beam deflection device 100 is configured such that a VCSEL structure is layered on a semiconductor substrate 20. The VCSEL structure includes a lower DBR (Distributed Bragg Reflector) 21, an active layer 22, and an upper DBR 23, formed on the semiconductor substrate 20. Furthermore, the seed light source 14 configured to generate slow light, the optical coupling unit 13 configured to guide the slow light, the linear waveguides 11, and the curved waveguides 12 are formed using a process such as an oxidative contraction process or an ion-implantation process such that they are monolithically integrated on a single substrate and such that they have respective predetermined waveguide widths, waveguide lengths, and curvatures. It should be noted that, in the example shown in FIG. 3, six linear waveguides 11 (#1 through #6) are integrated. Also, a desired number N (N represents an integer) of linear waveguides 11 may be integrated.

The seed light source 14 configured to generate slow light, the optical coupling unit 13 configured to guide the slow light, the linear waveguide 11, and the curved waveguide 12 are arranged such that they are aligned along a straight line.

The seed light source 14 that generates slow light is configured as a VCSEL that oscillates at a wavelength $\lambda_1$ in the vertical direction (Z direction). The seed light source 14 is capable of changing the oscillation wavelength $\lambda_1$ by means of a MEMS structure described in Patent document 6 or a thermal driving mechanism that controls the ambient temperature of the seed light source 14. Also, as indicated by the arrow 24, external light may be input via an inlet opening so as to generate the seed light Li.

Apart of the light intensity distribution 25 of the seed light source 14 (seed light Li) that oscillates at the wavelength $\lambda_1$ is optically coupled to the optical coupling unit 13. The optical coupling unit 13 converts the beam profile so as to raise the coupling efficiency with respect to the next-stage linear waveguide 11.

The linear waveguide 11 propagates the slow light while amplifying the slow light in the active layer 22. Accordingly, the linear waveguide 11 is configured to have a longitudinal structure with a waveguide length (or opening length L) on the order of 0.5 mm to 10 mm. The waveguide length is determined based on the number of the linear waveguides 11 required to support a desired light output and the required beam quality of the projected light pattern. The seed light Li is propagated and amplified as slow light multiply reflected in an approximately vertical direction. The output light Lo is emitted with a deflection angle $\theta_S$ from the outlet opening 10 formed in the upper-face portion of the linear waveguide 11. With the multiple-reflection angle of the slow light in the linear waveguide 11 as $\theta_1$, and with the emission angle of the output light Lo as $\theta_S$, Expression (1) described above holds true.

$$\sin \theta_S = n \sin \theta_i = n\sqrt{(1-(\lambda_1/\lambda_2)^2)} \tag{1}$$

Here, n represents the refractive index of the linear waveguide 11, and $\lambda_2$ represents the resonance frequency of the waveguide 11.

In this arrangement, the output light Lo is generated as coherent light having a coherent wavefront, thereby providing a very narrow beam divergence angle $\Delta\theta_d$iv in the deflection angle $\theta_S$ direction. The beam divergence angle $\Delta\theta_d$iv is represented by the following Expression (2) using the opening length L of the outlet opening 10 of the linear waveguide 11.

$$\Delta\theta_{div}=\lambda_1/(L\cdot\cos\theta_S) \quad (2)$$

That is to say, the beam divergence angle $\Delta\theta_d$iv becomes narrower according to an increase in the opening length L of the outlet opening 10. At the same time, this provides each linear waveguide 11 with a high output. With this, the deflection angle $\theta_S$ can be changed by changing the wavelength $\lambda_1$ of the seed light Li, thereby allowing the beam to be scanned.

Returning to FIG. 3, the curved waveguides 12 are coupled to the multiple linear waveguides 11 in series. With this arrangement, the multiple linear waveguides 11 are each configured to have the outlet opening 10 having approximately the same opening length L, and are arranged in parallel. It should be noted that at least an upper region 26 of the optical coupling unit 13, a region 27 of each linear waveguide 11 except for the outlet opening 10, and an upper region 28 of each curved region 12, are configured to shield light emission using a high-reflection material such as Au (gold) or the like.

Figure 5:
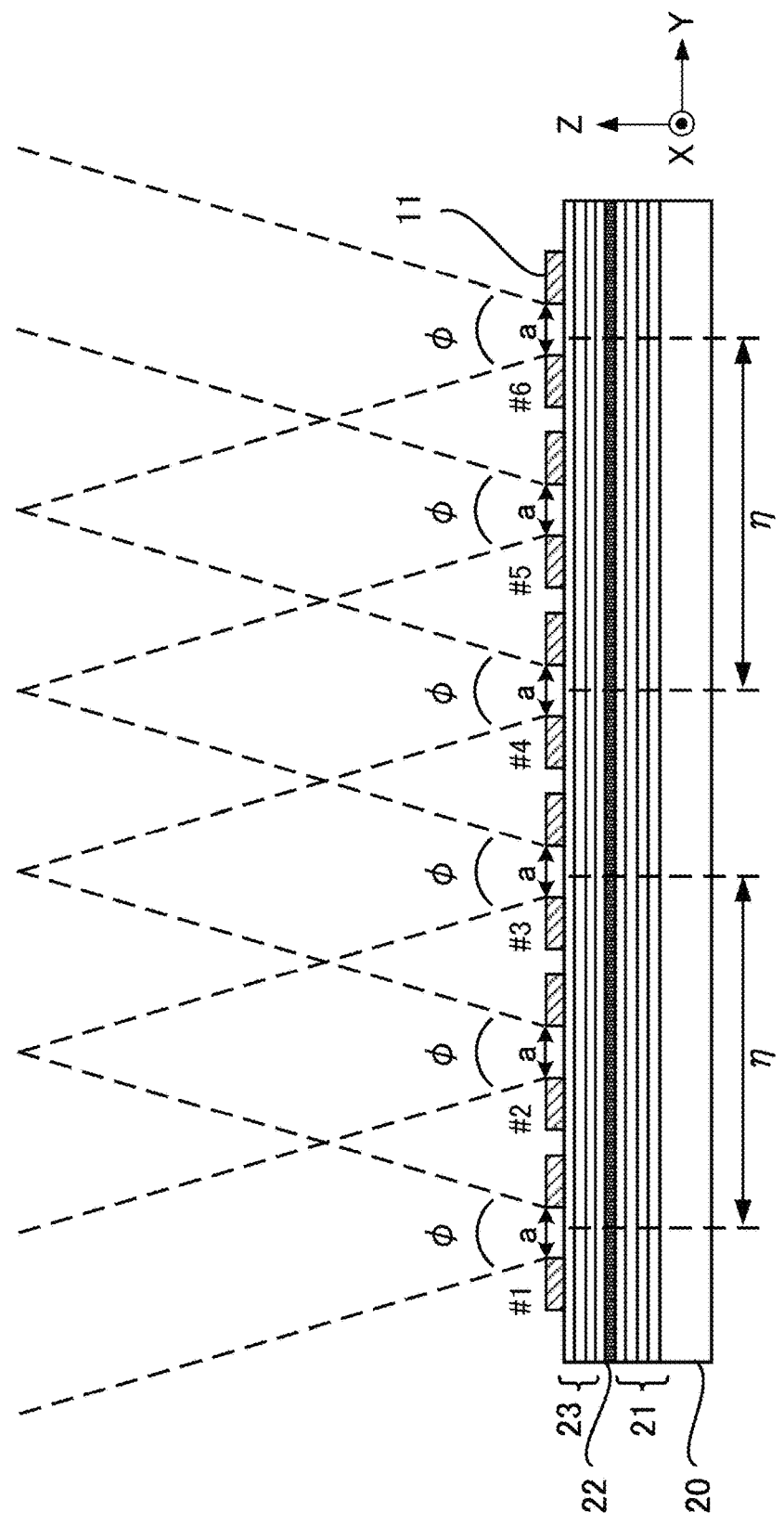
FIG. 5 is a cross-sectional diagram showing the beam deflection device according to the first embodiment taken along the line B-B' according to the first embodiment.

FIG. 5 is a cross-sectional diagram showing the beam deflection device 100 taken along the line B-B'. As shown in the cross-sectional diagram thus taken along the line B-B', the multiple linear waveguides 11 are arranged in parallel with a uniform pitch. In the drawing, each linear waveguide 11 is configured to have a uniform opening width a. The linear waveguides 11 through which the slow light is to be propagated in the same direction are arranged with a pitch η. In this case, the diffraction angle φ is represented by the following Expression (3).

$$\varphi=\lambda_1/a \quad (3)$$

In FIG. 3, the linear waveguides 11 are arranged in ascending order from the near side of the drawing. The light input from the seed light source 14 is sequentially propagated through the linear waveguides 11 #1 through 11 #6 coupled in series. The light is emitted from each outlet opening 10. The beam deflection device 100 according to the present embodiment is configured as a meander-shaped structure by means of the curved waveguides 12. Accordingly, as indicated by the arrows, the odd-numbered linear waveguides 11 (#1, #3, #5) each emit light in an upper-right direction in the drawing. Furthermore, the even-numbered linear waveguides 11 (#2, #4, #6) each emit light in an upper-left direction in the drawing.

That is to say, the beam deflection device 100 shown in FIG. 3 includes two sets of the beam deflection devices 200 described with reference to FIG. 1 or FIG. 2. The first set is configured of the odd-numbered slow-light waveguides 11 (#1, #3, #5). The second set is configured of the even-numbered slow-light waveguides 11 (#2, #4, #6).

With the beam deflection device 100, each odd-numbered linear slow-light waveguide and each even-numbered linear slow-light waveguide illuminate different regions. Accordingly, such an arrangement has an advantage of expanding the interference pattern scanning range. Furthermore, in a case in which slow light is propagated in the same direction for all the waveguides as shown in FIG. 1, there is a need to branch the input light Li and to couple the branched light with the multiple respective waveguides. In contrast, with the first embodiment, such an arrangement requires only one or two light sources arranged at one end or both ends of the meander-shaped waveguide. This allows the apparatus to have a simple configuration.

Figure 6:
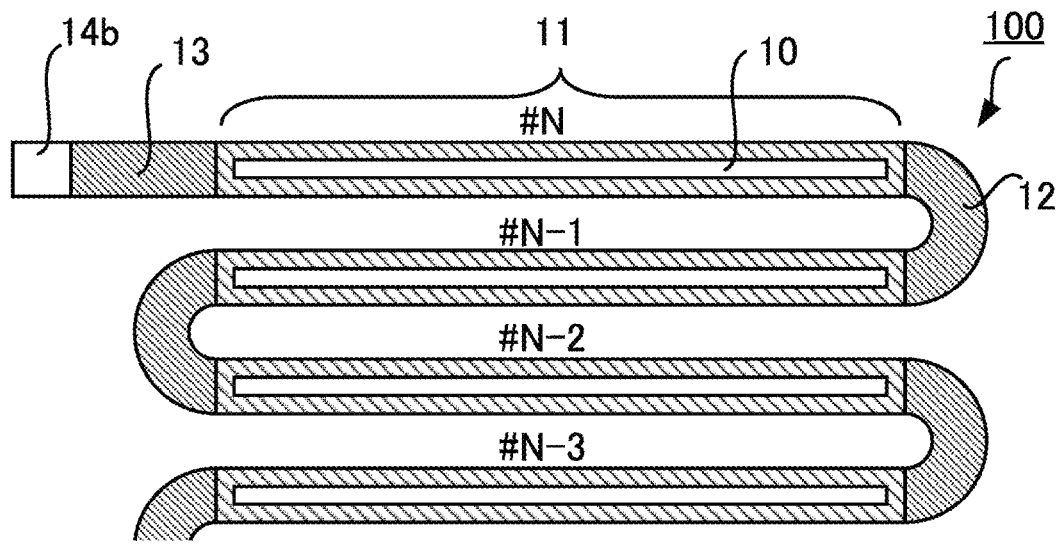
FIG. 6 is a plan view of the beam deflection device according to the first embodiment.
Figure 6:
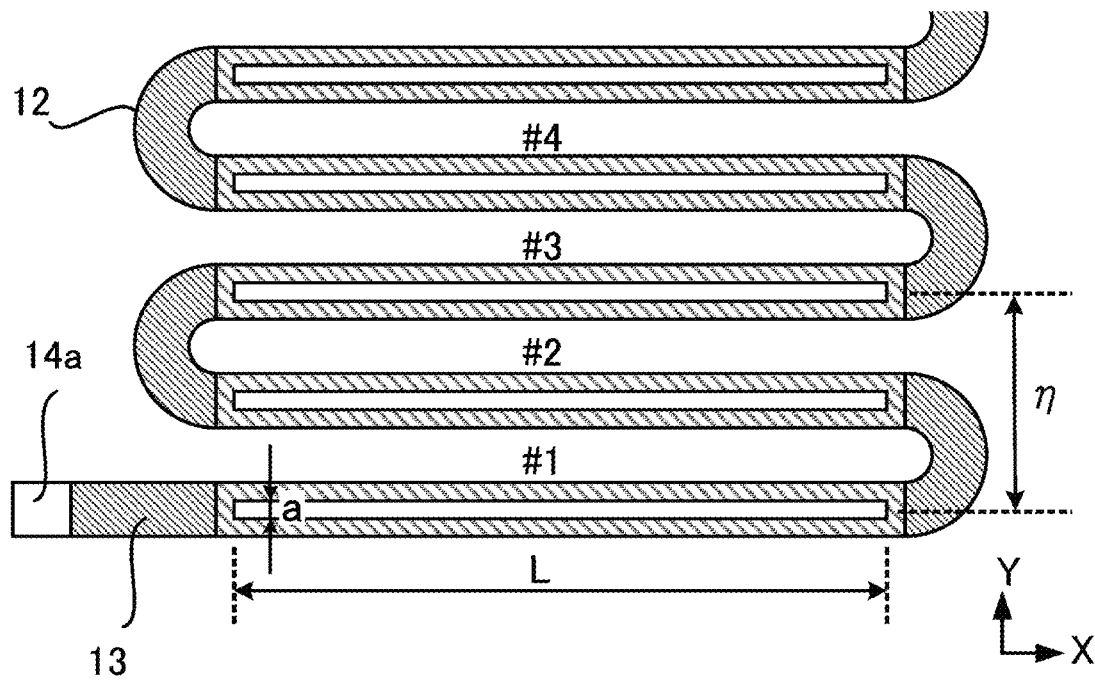

FIG. 6 is a plan view of the beam deflection device shown in FIG. 1. The multiple linear waveguides 11 are coupled via the curved waveguides 12 so as to form a meander-shaped waveguide. In this example, seed light sources 14a and 14b are arranged at both ends of the meander-shaped waveguide. By changing the wavelengths $\lambda_1$ provided by the seed light sources 14a and 14b, this arrangement allows the beam to be deflected with different deflection angles according to the respective wavelengths.

Figure 7:
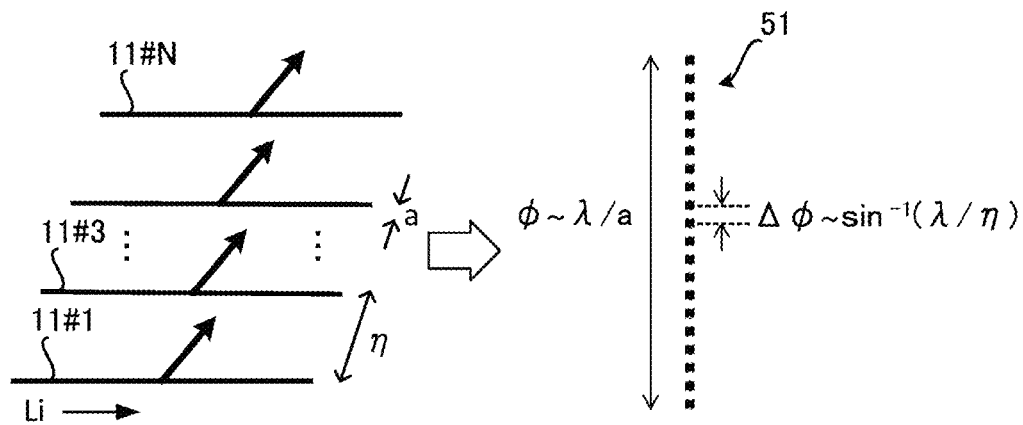
FIG. 7 is a diagram showing a projected light pattern emitted from odd-numbered waveguides according to the first embodiment.

FIG. 7 is a diagram showing a projected light pattern emitted from the odd-numbered linear waveguides 11 in a non-scanning mode. The seed light Li is input from the odd-numbered waveguide 11 #1. Description will be made with the pitch at which the odd-numbered linear waveguides 11 are arranged as "η", and with the opening width as "a" (see FIG. 5).

When light having a given wavelength $\lambda_1$ is guided in FIG. 7, as shown in FIG. 5, the light is emitted from each linear waveguide 11 at a diffraction angle φ determined based on Expression (3). The light emitted from the linear waveguides 11 that provide the same slow-light propagation direction (odd-numbered waveguides or even-numbered waveguides) interfere with each other in a direction (Y direction in the drawings) that is orthogonal to the slow-light propagation direction. By adjusting the pitch r and the opening width a, this arrangement allows a linear dot pattern 51 to be generated as an interference pattern of the emitted light. Furthermore, by increasing the number N of the linear waveguides 11 thus arranged, this arrangement is capable of supporting a large-output operation. Moreover, such an arrangement allows the dot structure (beam divergence angle) to be reduced. This allows the light power density to be raised for each dot.

The dot pitch Δφ of the interference pattern is represented by the following Expression (4) using the pitch η of the linear waveguides 11 that provides the same slow-light propagation direction (odd-numbered linear waveguides 11 or even-numbered linear waveguides 11).

$$\Delta\varphi=\sin^{-1}(\lambda_1/\eta) \quad (4)$$

Figure 8:
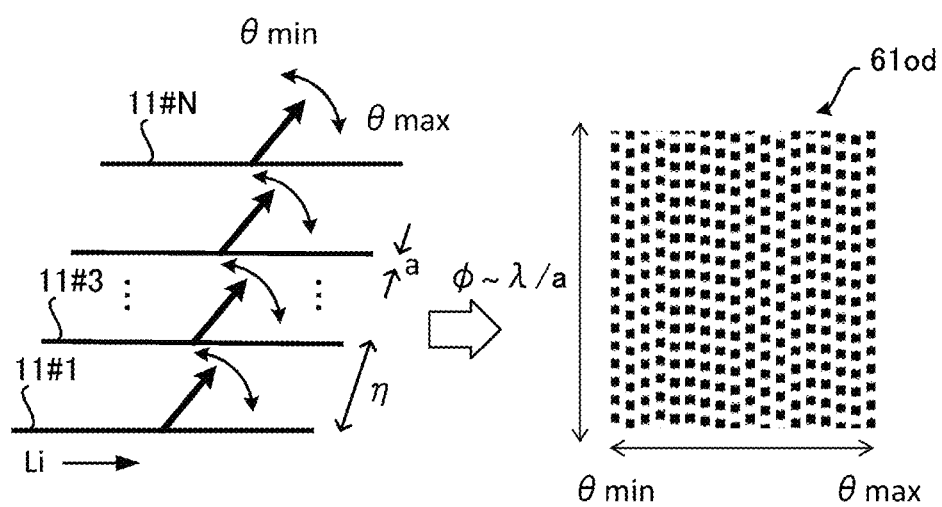
FIG. 8 is a diagram showing a projected light pattern emitted from the odd-numbered waveguides according to the first embodiment.

FIG. 8 is a diagram showing a projected light pattern obtained by scanning the dot pattern shown in FIG. 7. In a case in which the wavelength $\lambda_1$ of the seed light Li generated by the seed light source 14 is changed in a discrete manner, this arrangement allows the beam to be scanned in a range of the deflection angle $\theta_S$ from $\theta_{min}$ up to $\theta_{max}$, thereby generating a two-dimensional dot pattern 61od.

It should be noted that the two-dimensional dot pattern 61od is not generated in a perfect grid shape. Specifically, the dot positions deviate in a direction that is orthogonal to the scanning direction according to the deflection angle $\theta_S$ applied in the scanning. This is due to the deviation of the phase of the light emitted from each linear waveguide 11 due to the change in the wavelength $\lambda_1$ of the seed light Li. In a case in which the two-dimensional dot pattern 61od is required to have such a grid shape, each curved waveguide 12 may preferably be provided with a phase adjustment function as an additional function, for example, such that the light emitted from each linear waveguide 11 has a uniform phase.

Figure 9:
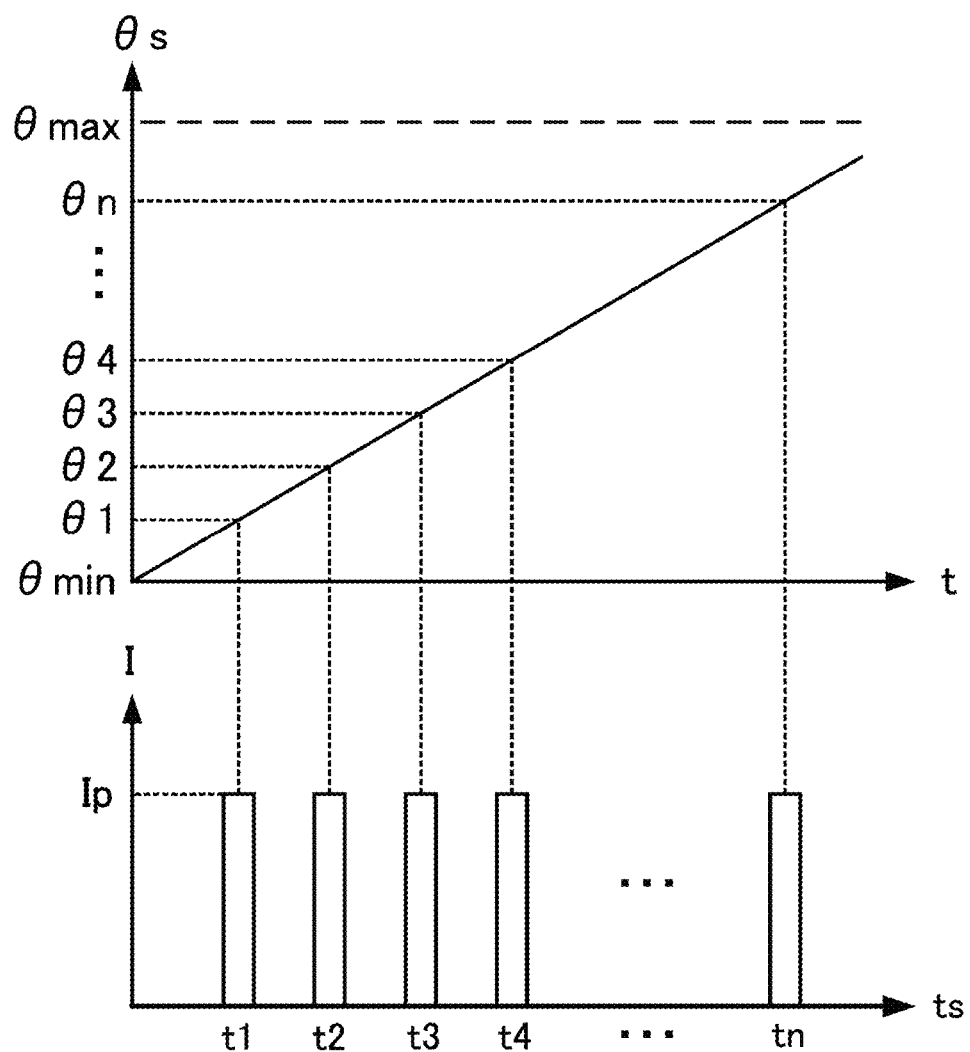
FIG. 9 is an explanatory diagram for explaining a time profile to be used to scan the beam according to the first embodiment.

FIG. 9 is an explanatory diagram for explaining the time profile for supporting the beam scanning. The beam deflection device 100 according to the present embodiment generates a desired number of scanning patterns based on the time profile.

First, the angles $\theta_{min}$ and $\theta_{max}$ are set so as to determine the range of the deflection angle $\theta_S$. Next, the number of line beams n to be provided to the deflection angle range in the scanning operation is set. FIG. 9 shows an example in which the deflection angle $\theta_S$ ($\theta 1$ through $\theta n$) at which the light is emitted from the beam deflection device 100 is continuously scanned with time. For example, when the deflection angle $\theta_S$ becomes $\theta 1$ at the time point t1, the intensity Ip of the seed light Li is changed with time in a pulse shape. The same processing is repeated n times for the deflection angles $\theta 1$ through $\theta n$ at the time points t1 through tn.

Figure 10:
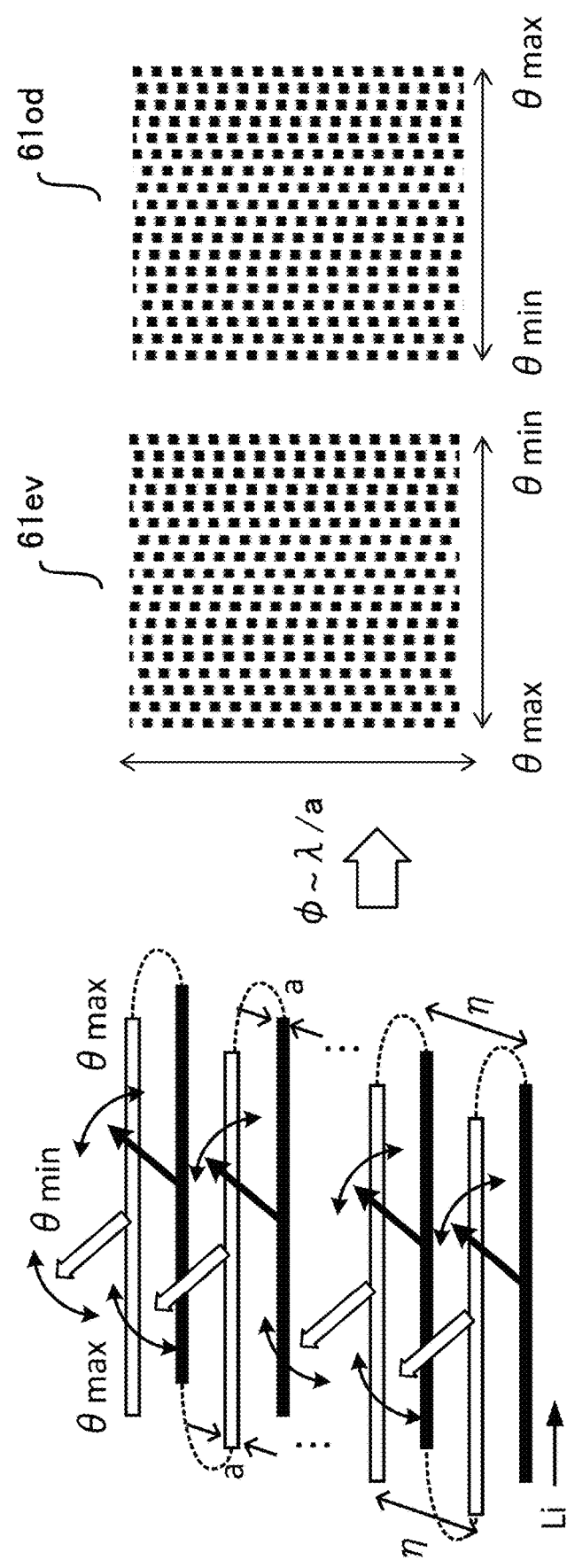
FIG. 10 is a diagram showing a projected light pattern provided by the beam deflection device according to the first embodiment.

FIG. 10 is an explanatory diagram for explaining the projected light patterns emitted from the odd-numbered linear waveguides 11 and the even-numbered linear waveguides 11. FIG. 8 shows the projected light pattern 61od emitted from the odd-numbered linear waveguides 11. At the same time, a similar pattern 61ev is projected from the even-numbered linear waveguides 11. There is an axisymmetric relation between the projected light patterns 61od and 61ev. As described above, the projected light patterns 61od and 61ev having such an axisymmetric relation may be projected at the same time to a measurement target in three-dimensional measurement. Alternatively, one from among the projected light patterns 61od and 61ev may be employed as a projected light pattern to be projected to a measurement target. The other projected light pattern may be employed as a reference pattern in the three-dimensional measurement.

As described above, with the first embodiment, this arrangement is capable of generating a dot-shaped projected light pattern. Furthermore, by adjusting the number of the linear waveguides 11 thus arranged, this arrangement supports a high output capacity and a high-quality beam profile, thereby allowing the power density of each dot to be increased. Moreover, with such an arrangement, the linear waveguides 11 are arranged so as to form a meander structure, thereby allowing the device size to be reduced.

Second Embodiment

Figure 11:
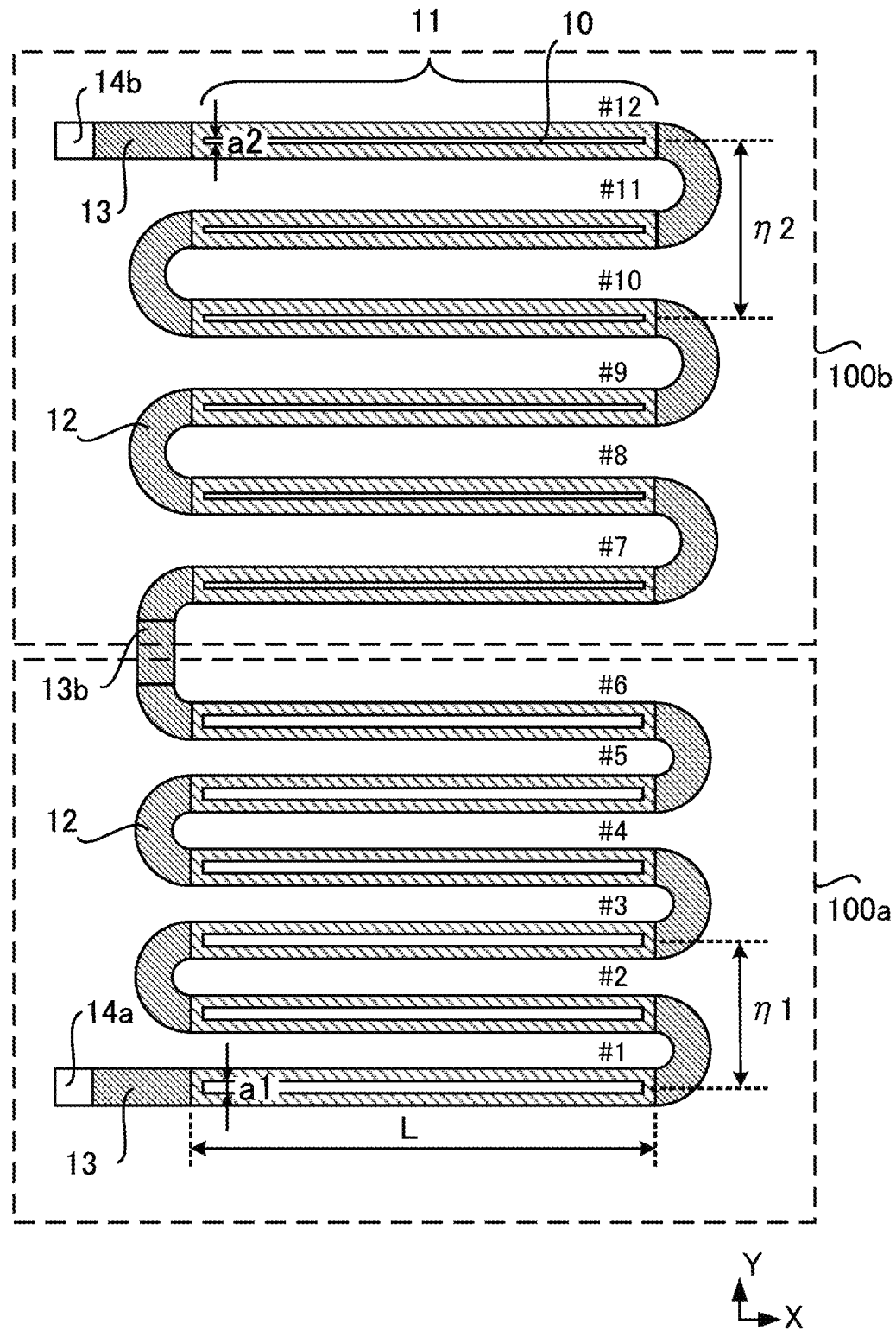
FIG. 11 is a plan view showing a beam deflection device according to a second embodiment.

Description will be made in the second embodiment regarding a technique for generating a more complicated dot pattern. FIG. 11 is a plan view of a beam deflection device according to the second embodiment. The point of difference between it and the arrangement shown in FIG. 6 is that, in the second embodiment, multiple linear waveguides 11 are divided into blocks such that each block includes multiple linear waveguides 11. Furthermore, the opening width a of the outlet opening 10 of each linear waveguide 11 and the pitch η are designed such that there is a difference in one or both of the opening width a and the pitch η between different blocks.

FIG. 11 shows an example in which the multiple linear waveguides 11 are divided into a block 100a including the linear waveguides 11 #1 through 11 #6 and a block 100b including the linear waveguides 11 #7 through 11 #12. In this example shown in the drawing, there is a difference in both the opening width a and the pitch η between the blocks 100a and 100b. With such an arrangement, the beam deflection device 100 having such a layout emits a projected light pattern configured as a superimposed pattern of multiple patterns projected with different diffraction angles φ and different dot pitches Δφ. This allows the dot pattern density (the number of dot patterns) to be raised. The number of blocks to be generated is not restricted to two. That is to say, a desired number of blocks may be generated. In this case, the same number of projected light patterns as that of the blocks thus generated are superimposed.

In a case in which the beam deflection device is designed such that there is a difference only in the opening width a between the blocks, dot patterns having different diffraction angles φ are superimposed. In a case in which the beam deflection device is designed such that there is a difference only in the pitch η between the blocks, dot patterns having different dot pitches Δφ are superimposed.

In a case in which it is desirable to separate the dot patterns projected from the blocks, the seed light sources 14 (14a and 14b in FIG. 11) may preferably be provided for the respective blocks. Furthermore, the seed light sources 14 may preferably generate the projected light patterns with different wavelengths $\lambda_1$ or different time profiles. With an embodiment, the optical coupling unit 13b that couples the blocks 100a and 100b may be omitted. Furthermore, the blocks 100a and 100b may each be controlled as an independent beam deflection device.

With the second embodiment, in addition to the effects provided by the first embodiment, multiple projected light patterns designed such that there is a difference in at least one from among or both the diffraction angle φ and the dot pitch Δφ can be superimposed and projected. Also, in a case in which a seed light source is arranged for each block, this arrangement allows temporal separation of the respective projected light patterns.

Third Embodiment

Figure 12:
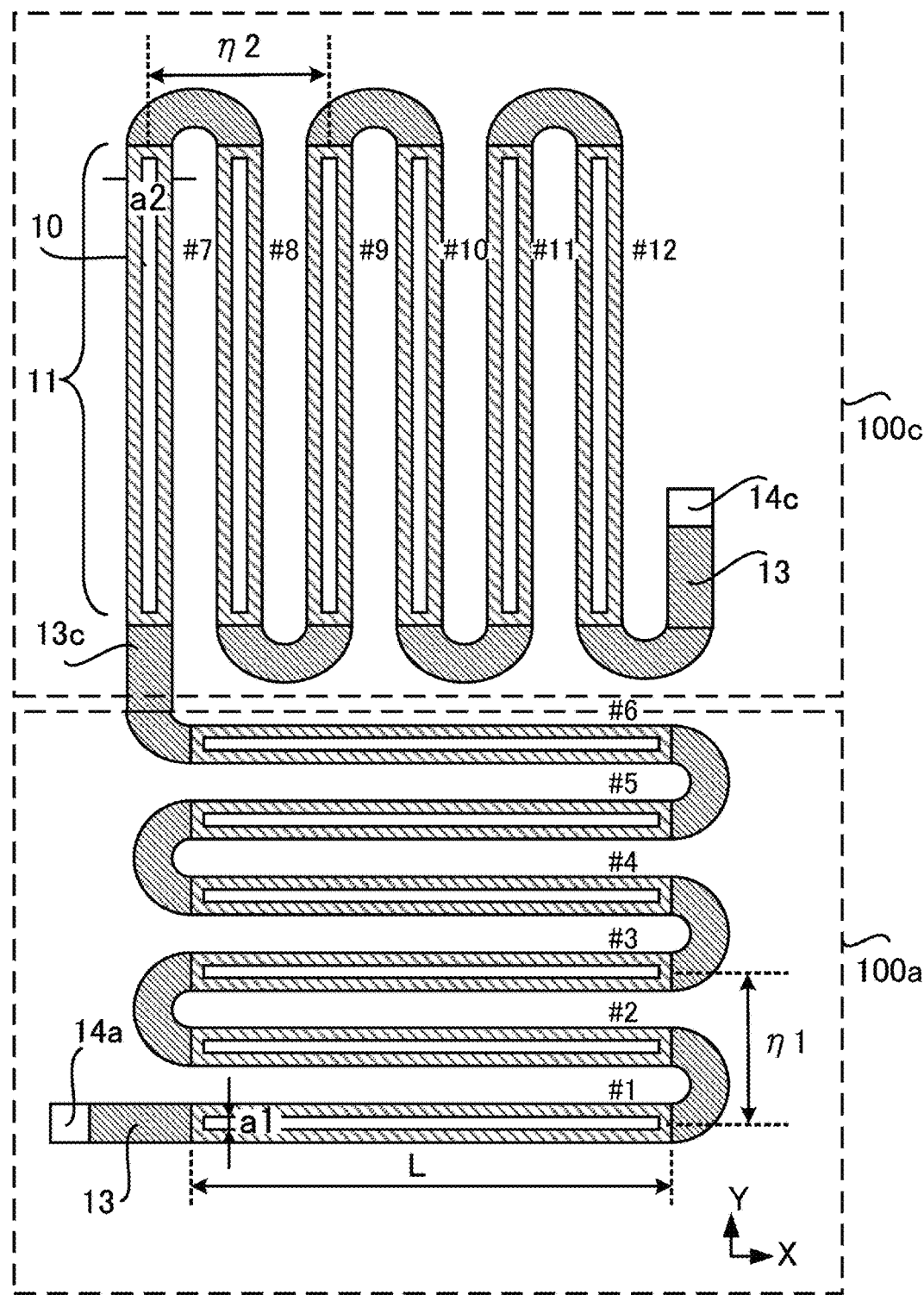
FIG. 12 is a plan view showing a beam deflection device according to a third embodiment.

FIG. 12 is a plan view of a beam deflection device according to a third embodiment. The greatest point of difference between it and the arrangement shown in FIG. 11 is that, in this example, the block 100b is arranged with a rotation of 90 degrees such that the linear waveguides 11 of the block 100a and the linear waveguides 11 of the block 100c are orthogonal to each other. The layout angle between the blocks is not restricted to 90 degrees. That is to say, a desired angle may be employed as the layout angle. In addition, the beam deflection device may be designed such that there is a difference in the opening width a and the pitch η between the blocks.

With the third embodiment, multiple projected light patterns designed such that there is a difference in at least one from among or both the diffraction angle φ and the dot pitch Δφ can be superimposed and projected with different layout angles. Furthermore, as with the second embodiment, in a case in which seed light sources 14 (14a and 14c in FIG. 12) are arranged for the respective blocks, this arrangement allows temporal separation of the projected light patterns.

Fourth Embodiment

Figure 13:
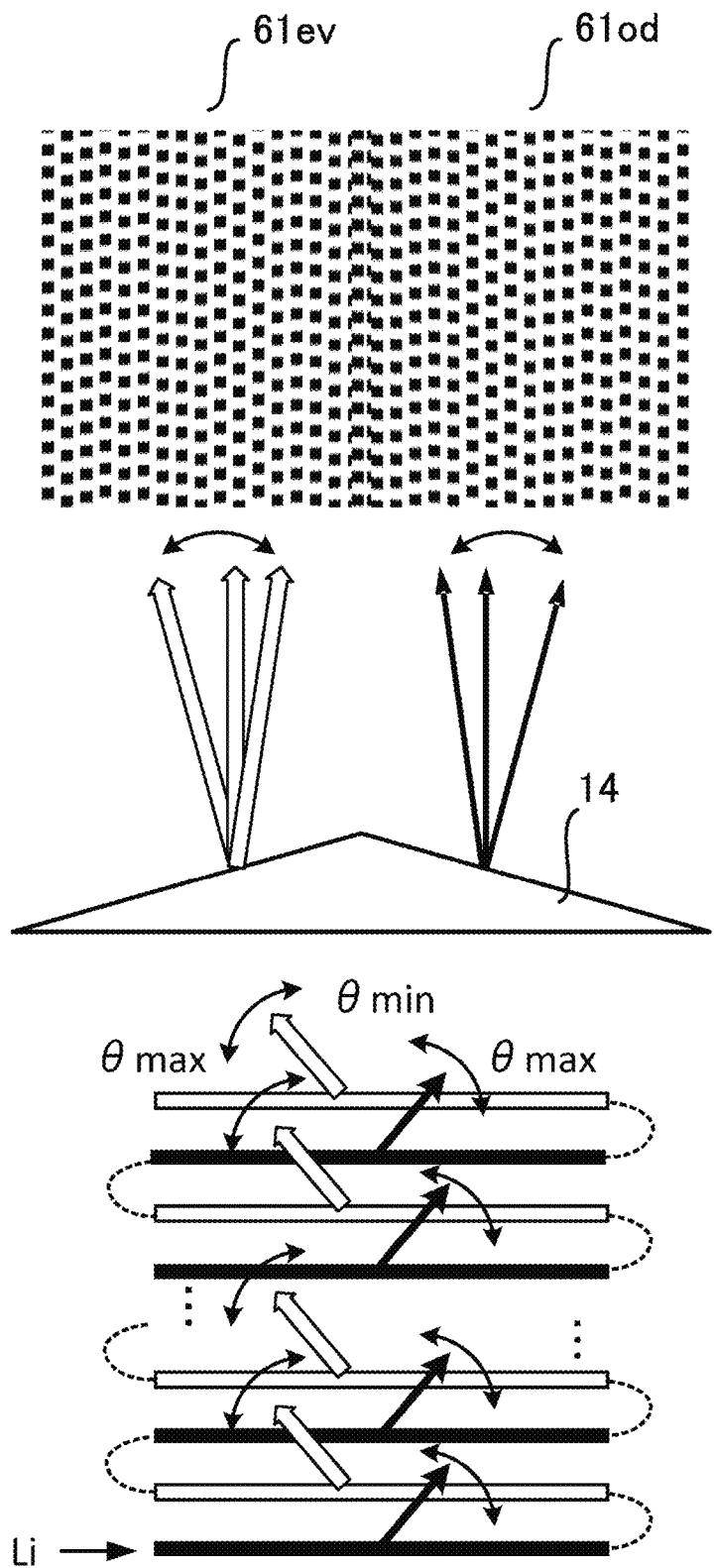
FIG. 13 is a schematic diagram showing a beam deflection device according to a fourth embodiment.

FIG. 13 is a schematic diagram showing a beam deflection device according to a fourth embodiment. It is difficult for the beam deflection device 100 according to the present embodiment to emit abeam in a direction that is orthogonal to the semiconductor substrate 20. Accordingly, in a case in which the target of the projected light is positioned in front of the semiconductor substrate 20, the beam deflection device 100 is mounted with a tilt. Alternatively, as shown in FIG. 13, an optical component is arranged on the upper side of the beam deflection device 100 so as to change the output angle of the deflected beam. In the example shown in FIG. 13, a lens 111 having a triangular shape is arranged above the beam deflection device 100, which allows the projected light pattern 61od emitted from the odd-numbered linear waveguides 11 and the projected light pattern 61ev emitted from the even-numbered linear waveguides 11 to be superimposed and projected.

With the fourth embodiment, this allows the beam deflection device 100 to emit a projected light pattern in a vertical direction. Furthermore, such an arrangement is capable of superimposing and projecting the projected light pattern 61od emitted from the odd-numbered linear waveguides 11 and the projected light pattern 61ev emitted from the even-numbered linear waveguides 11. This allows a projected light pattern to be generated with a large deflection angle.

Fifth Embodiment

Figure 14:
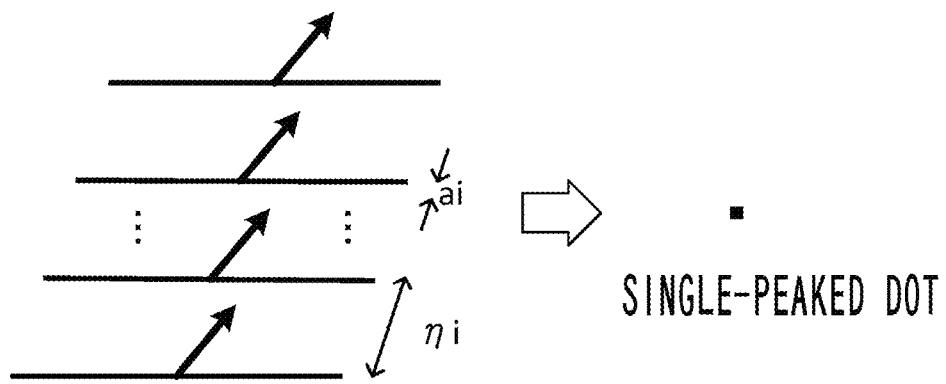
FIG. 14 is a diagram showing a projected light pattern emitted from odd-numbered waveguides according to a fifth embodiment.
Figure 15:
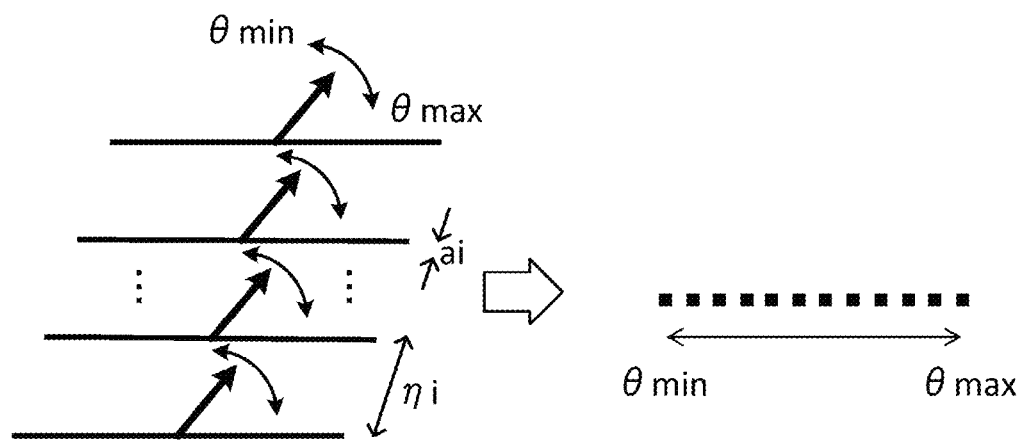
FIG. 15 is a diagram showing a projected light pattern emitted from the odd-numbered waveguides according to the fifth embodiment.

FIG. 14 is an explanatory diagram for explaining the projected light pattern emitted from the odd-numbered linear waveguides 11 in a non-scanning mode according to a fifth embodiment. FIG. 15 is an explanatory diagram for explaining the projected light pattern in a scanning mode. The seed light Li is input via the linear waveguide 11 #1. The linear waveguides 11 are designed with arbitrary pitches $\eta i$ (i=#1 through #N−1) and arbitrary opening widths ai (i=#1 through #N−1) so as to generate a desired dot pattern.

Description has been made in the embodiments 1 through 4 regarding an example in which a line-shaped dot pattern with the deflection angle $\theta_S$ is scanned so as to project a dot-shaped two-dimensional pattern. With the present embodiment, the linear waveguides 11 are designed such that there is a difference in the pitch $\eta$ and the opening width a in a non-uniform manner so as to generate a single-peaked dot 121. Furthermore, the single-peaked dot 121 is scanned according to a time profile so as to generate a line-shaped dot pattern 131 in the deflection angle direction.

Figure 16:
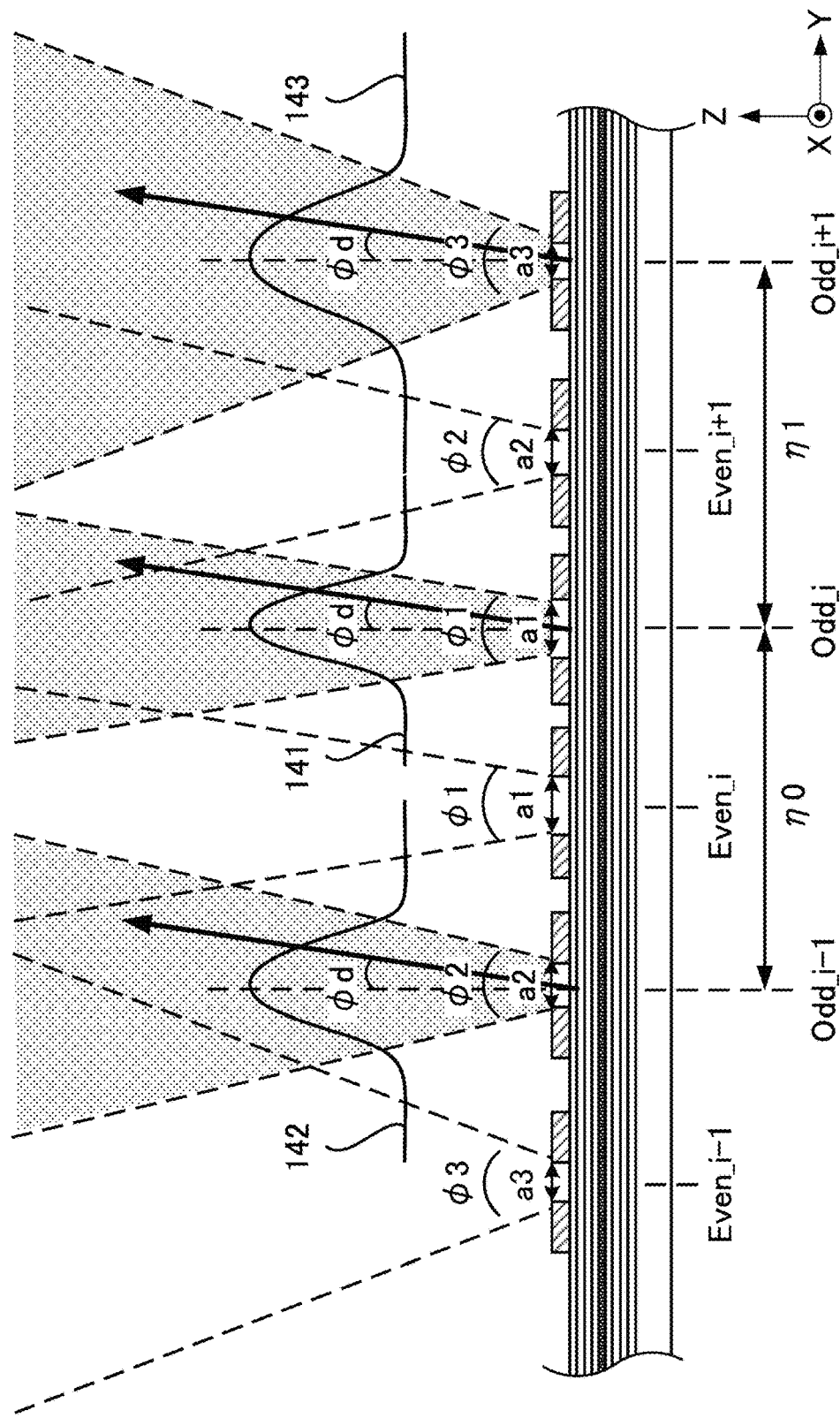
FIG. 16 is an operation explanatory diagram for explaining the operation of a beam deflection device according to the fifth embodiment.

FIG. 16 is an explanatory diagram showing a schematic operation for generating a single-peaked dot. Description will be made below with an odd-numbered linear waveguide 11 positioned in the vicinity of the center of the beam deflection device 100 as "Odd_i", and with the linear waveguides 11 adjacent to Odd_i as "Odd_i−1" and "Odd_i+1". Furthermore, description will be made below with the opening width of Odd_i as "a1", with the opening width of Odd_i−1 as "a2", and with the opening width of Odd_i+1 as "a3". Furthermore, description will be made below with the pitch between Odd_i and Odd_i−1 as $\eta0$, and with the pitch between Odd_i and Odd_+1 as $\eta1$.

With this arrangement, the linear waveguides 11, i.e., Odd_i−1, Odd_i, and Odd_i+1, provide diffraction angles $\varphi2$, $\varphi1$, and $\varphi3$, respectively. The linear waveguides 11, i.e., Odd_i−1, Odd_i, and Odd_i+1, emit light with different beam profiles 142, 141, and 142, respectively. In the vertical direction, all the beam profiles 142, 141, and 142 are added at a distant position. However, in a diffraction angle direction (which is indicated by "$\varphi d$" in the drawing) that differs from the vertical direction, there is a phase difference between Odd_i−1, Odd_i, and Odd_i+1. Description has been made above regarding an example provided by three of the linear waveguides 11. Also, N of the linear waveguides 11 may be designed so as to provide diffraction phases such that there is no strong interference in all the directions except for the vertical direction, thereby providing a single-peaked dot profile.

By changing the pitch $\eta$, this arrangement is capable of causing a large change in the phase difference between the linear waveguides 11. Furthermore, by changing the opening width a, this arrangement is capable of causing a small change in the phase difference between the linear waveguides 11. Accordingly, the linear waveguides 11 thus designed with different pitches $\eta$ or different opening widths a in a non-uniform manner is also effectively applicable to other usages in addition to the generation of a single-peaked dot. Also, in the embodiments 1 through 4, the pitch $\eta$ or the opening width a may be finely adjusted for each linear waveguide 11 so as to provide uniform intensity for each dot, or to suppress or enhance a high-order interference pattern that occurs in the line-shaped dot pattern, thereby providing a desired projected light pattern.

With the fifth embodiment, this arrangement is capable of generating a single-peaked dot. This allows a beam having a higher power density to be generated and scanned.

Description has been made in the embodiments with reference to embodiments 1 through 5 as examples. However, it is needless to say that the present invention is not restricted to such examples. Various combinations of the embodiments may be made. This allows complicated projected light patterns to be generated, which can be employed in various kinds of usages.

Also, an arrangement may be made in which a current is supplied independently for each linear waveguide 11 so as to provide each linear waveguide with uniform light power emission. Description has been made in the present embodiments regarding an arrangement in which the linear waveguides 11 are coupled so as to form a multi-stage structure, thereby supporting high output capacity. Furthermore, the linear waveguides 11 are arranged so as to form a meander-shaped slow-light waveguide, thereby allowing the linear waveguide structure to have a compact size. It should be noted that description has been made in the embodiments regarding an arrangement employing a slow-light waveguide having a VCSEL structure. Also, the present invention is applicable to various kinds of slow-light waveguides such as a slow-light waveguide employing a photonic crystal.

Description has been made regarding several embodiments of the present invention. However, the embodiments have been described for exemplary purposes only, and are by no means intended to restrict the scope of the present invention. The novel embodiments are applicable to various kinds of other embodiments, and various kinds of omission, replacement, and change can be made without departing from the sprit and scope of the present invention. The embodiments and modifications thereof are encompassed in the technical scope of the present invention, and are also encompassed in the invention disclosed in the appended claims and equivalences thereof.

RELATED ART DOCUMENTS

Patent Documents

1. U.S. Pat. No. 8,320,621 B2
2. US Patent Application Publication No. 2014/0211215 A1
3. US Patent Application Publication No. 2016/0025993 A1
4. Japanese Patent Application Laid Open No. 2004-333369
5. Japanese Patent Application Laid Open No. 2017-157609
6. Japanese Patent Application Laid Open No. 2013-016591

Non-Patent Documents

1. T. Matsuda, F. Abe, and H. Takahashi, "Laser printer scanning system with a parabolic mirror" Appl. Opt., vol. 17, no. 6, pp. 878-884, March 1978.

2. P. F. V. Dessel, L. J. Hornbeck, R. E. Meier, and M. R. Douglass, "A MEMS-based projection display," Proc. IEEE, vol. 86, no. 8, pp. 1687-1704, August 1988.
3. K. Nakamura, J. Miyazu, M. Sasaura, and K. Fujiura, "Wide-angle, low-voltage electro-optic beam deflection based on space-charge-controlled mode of electrical conduction in KTa1xNbxO3," Appl. Phys. Lett., vol. 89, no. 3, pp. 131115-1-131115-3, September 2006.
4. Y Kurosaka, S. Iwahashi, Y Liang, K. Sakai, E. Miyai, W Kunishi, D. Ohnishi, and S. Noda, "On-chip beam-steering photonic-crystal lasers," Nat. Photon., vol. 4, no. 7, pp. 447-450, May 2010.
5. J. K. Doylend, et. al., "Two-dimensional free-space beam steering with an optical phased array on silicon-on-insulator," Optics Express, vol. 19, no. 22, pp. 21595-21604, 2011.
6. X. Gu, T. Shimada, and F. Koyama, "Giant and high-resolution beam steering using slow-light waveguide amplifier," Opt. Exp., vol. 19, no. 23, pp. 22 675-22 683, November 2011.
7. M. Nakahama, X. Gu, T. Shimada, and F. Koyama, "On-Chip high-resolution beam scanner based on Bragg reflector slow-light waveguide amplifier and tunable micro-electro-mechanical system vertical cavity surface emitting laser," Jpn. J. Appl. Phys., vol. 51, no. 4, pp. 040208-1-040208-3, March 2012.

The invention claimed is:

1. A beam deflection device comprising a plurality of linear slow-light waveguides arranged adjacent to each other in a first direction,
wherein each linear slow-light waveguide is structured to have a rectangular outlet opening with the first direction as a lateral direction thereof and with a second direction that is orthogonal to the first direction as a longitudinal direction thereof,
and wherein the beam deflection device is configured to allow a resonance wavelength of the linear slow-light waveguides and a wavelength of a slow light generated as a propagating wave that propagates through the linear slow-light waveguides to be relatively controlled, wherein the plurality of linear slow-light waveguides is coupled in series.

2. The beam deflection device according to claim 1, further comprising a plurality of coupling waveguides structured to couple the plurality of linear slow-light waveguides so as to form a meander waveguide having a meander structure in which at least one of the plurality of coupling waveguides is curved.

3. The beam deflection device according to claim 2, further comprising a seed light source arranged at one end of the meander waveguide and structured to inject a seed light.

4. The beam deflection device according to claim 1, wherein a seed light source structured to inject a seed light is further provided to one end of each of the plurality of linear slow-light waveguides.

5. The beam deflection device according to claim 1, wherein the linear slow-light waveguide is structured to have a VCSEL (Vertical Cavity Surface Emitting Laser) structure comprising a DBR (Distributed Bragg Reflector) and an active layer.

6. The beam deflection device according to claim 1, wherein the plurality of linear slow-light waveguides are arranged in parallel at an approximately uniform pitch.

7. The beam deflection device according to claim 1, wherein the pitch of the plurality of linear slow-light waveguides is adjusted such that an output light of the plurality of linear slow-light waveguides generates an interference pattern including a plurality of dots arranged at a uniform pitch in a far field.

8. The beam deflection device according to claim 1, wherein the pitch of the plurality of linear slow-light waveguides is adjusted such that an output light of the plurality of linear slow-light waveguides generates a single-peaked interference pattern in a far field.

* * * * *